United States Patent [19]

Smith

[11] Patent Number: 4,550,292
[45] Date of Patent: Oct. 29, 1985

[54] AUTOMATIC OSCILLATOR FREQUENCY CONTROL SYSTEM

[75] Inventor: Stephen F. Smith, Knoxville, Tenn.

[73] Assignee: The United States of America as represented by the Administrator of the National Aeronautics and Space Administration, Washington, D.C.

[21] Appl. No.: 529,803

[22] Filed: Sep. 6, 1983

[51] Int. Cl.$^4$ ............................................. H03L 7/08
[52] U.S. Cl. ........................................ 331/2; 331/1 A
[58] Field of Search ................... 331/1 A, 2, 14, 16; 375/120; 455/260

[56] References Cited

U.S. PATENT DOCUMENTS

| | | | |
|---|---|---|---|
| 3,913,028 | 10/1975 | Bosselaers | 331/1 A |
| 4,086,544 | 4/1978 | Fried | 331/1 A |
| 4,121,162 | 10/1978 | Alberkrack et al. | 325/421 |
| 4,190,807 | 2/1980 | Weber | 331/1 A |
| 4,305,045 | 12/1981 | Metz et al. | 331/1 A |
| 4,462,110 | 7/1984 | Baldwin et al. | 375/120 X |

FOREIGN PATENT DOCUMENTS 2073981 10/1981 United Kingdom ............... 331/1 A

Primary Examiner—Eugene R. LaRoche
Assistant Examiner—Robert J. Pascal
Attorney, Agent, or Firm—John O. Tresansky; John R. Manning; Ronald F. Sandler

[57] ABSTRACT

A frequency control system is provided which makes an initial correction of the frequency ($f_{CLK}$) of its own timing circuit (50, 52, 54, 56) after comparison against a frequency ($f_{REF}$) of known accuracy and then sequentially checks and corrects the frequencies of several voltage (13a ... 13e) controlled local oscillator circuits (12a ... 12e). The timing circuit initiates the machine cycles of a central processing unit (30) which, over a sampling interval having a duration of a fixed number of machine cycles, applies a frequency index (FI) to an input register (22) in a modulo-sum frequency divider stage (20) and enables a multiplexer (16) to clock an accumulator register (26) in the divider stage (20) with a cyclical signal derived from the oscillator circuit being checked. Upon expiration of the interval, the processing unit (30) compares the remainder (FN) held as the contents of the accumulator (26) against a stored zero-error constant and applies an appropriate correction word (CW) to a correction stage (60a, 62a, ... 64a, ... 60e, 62e, 64e) to shift the frequency of the oscillator being checked. A signal taken from the accumulator register (26) may be used to drive a phase plane ROM (94) and, with periodic shifts in the applied frequency index (FI), to provide frequency shift keying of the applied resultant output signal. Interposition of the phase adder (90) between the accumulator register (26) and phase plane ROM (94) additionally permits phase shift keying of the output signal by periodic variation in the value of a phase index (PI) applied to one input port of the phase adder (90). An overflow signal may be taken from an adder (24) in the frequency divider stage (20) to drive an auxiliary counter (120) to provide a prescaling number which can be used by the central processing unit (30) to expand the correction range of the control system.

16 Claims, 6 Drawing Figures

AUTOMATIC OSCILLATOR FREQUENCY CONTROL SYSTEM

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457).

TECHNICAL FIELD

This invention relates to frequency control systems and, more particularly, to a system for automatically controlling the frequency of an electronic oscillator.

BACKGROUND ART

Electronic oscillators have long served as local frequency sources for such diverse applications as generating fixed carrier frequencies in radio transmitters and controlling synchronism in digital data processors. With the advent of high frequency, multiple channel data networks, it has become critically important for error free operation to maintain each local oscillator in continuous operation at a single, invariant frequency. In a network providing for transmission of data over narrow bandwidth, radio frequency channels, for example, a minor drift in one oscillator frequency of merely a few cycles will cause interference in neighboring channels resulting in the loss of nearly all data transmitted over the affected channels. Moreover, if the oscillator also serves as a local clock in a data transmission network, the same frequency drift will cause a delay in transmission which will interfere with transmissions by other networks allocated different time slots on the same channel. The effects of frequency drift are compounded if the network depends upon some form of angle modulation for processing transmitted digital data.

Early efforts to avoid the occurrence of frequency drift tended to concentrate on the quality of the oscillator and the stability of its environment with techniques such as using a crystal for controlling the oscillator's frequency and maintaining the crystal inside an oven at a constant temperature. The use of high quality crystals maintained in ovens, however, does not obviate such causes of long term frequency drift as crystal aging. Moreover, high quality crystals mounted inside ovens are not only too expensive for most applications, particularly multi-channel networks where each channel usually has a discrete oscillator, but necessitates a large source of constant power to maintain the oven temperatures. This latter requirement renders high quality, oven-mounted crystals unsuitable for use in remotely deployed networks powered by small batteries.

More recent efforts have concentrated upon development of phase locked loops for detecting and correcting frequency drift of a variable-frequency local oscillator. In one instance, this required the use of a digital counter being enabled by a master clock during a sampling interval to count pulses of the variable local oscillator. At the end of the sampling interval, the contents of the counter are compared by a microprocessor with a predetermined digital word stored in memory. Any difference between the counter contents and the digital word is then used, in successive steps, to vary the frequency of the local oscillator.

Another effort uses programmable microprocessors timed by external frequency standards in phase-locked loops to control the frequencies of a plurality of digitally-variable slave oscillators. The microprocessors compare control words as generated with the same words after those words have been cycled through the phase-locked loops. Then, error signals proportional to differences between the generated and cycled words are applied to the slave oscillators to shift their resonant frequencies.

The precision to which these prior art approaches are able to maintain the frequency of an electronic oscillator is inherently limited by both the duration of their sampling intervals and the bit capacity of their counter registers. Substantially longer sampling intervals are infeasible because longer intervals would limit the availability of the oscillators for their intended purposes while larger registers are expensive and necessarily require microprocessors with larger data handling capacities. Moreover, a satisfactory degree of long-term oscillator stability can be achieved in a phase locked loop approach only by integrating several samplings taken over a large number of oscillator cycles, a procedure which is undesirable because it not only limits the useful availability of an oscillator for other uses but also consumes greater quantities of microprocessor time per oscillator and thereby limits the number of oscillators which can be controlled by a single frequency control system.

STATEMENT OF INVENTION

Accordingly, it is one object of this invention to provide an improved system for controlling the frequency of an electronic oscillator.

It is another object to provide a system for automatically stabilizing the frequency of an oscillator with minimal consumption of power.

It is still another object to provide a system for automatically counteracting long-term drift in the frequency of an oscillator.

It is a still further object to provide a system for simultaneously controlling the frequencies of several oscillators.

It is also an object to provide a programmable system for automatically controlling the frequencies of one or more oscillators in a single network.

It is another object to provide a system for digitally modulating the frequency and phase of a cyclical signal.

These and other objects are achieved with a system for automatically controlling the frequencies of one or more electrically controllable oscillators through sequential correction iterations. A cyclical signal from one of the local oscillators is passed by a multiplexer held in an enabled condition during a sampling interval regulated by a timing stage and used to clock an accumulator register of a modulo-sum frequency divider. The contents of the accumulator are incremented during each pulse of the cyclical signal by a frequency index number supplied by a central processing unit. After termination of the sampling interval, the contents of the accumulator register are compared by a central processing unit with a predetermined ideal count stored in memory. Any variation found during the comparison generates a correction word which is applied to shift the frequency of the oscillator.

BRIEF DESCRIPTION OF DRAWINGS

A more complete appreciation of this invention and many of the attendant advantages thereof will be readily apparent as the same becomes better understood by reference to the following detailed description in which like numbers indicate the same or similar components, and wherein.

DETAILED DESCRIPTION OF THE INVENTION

Figure 1:
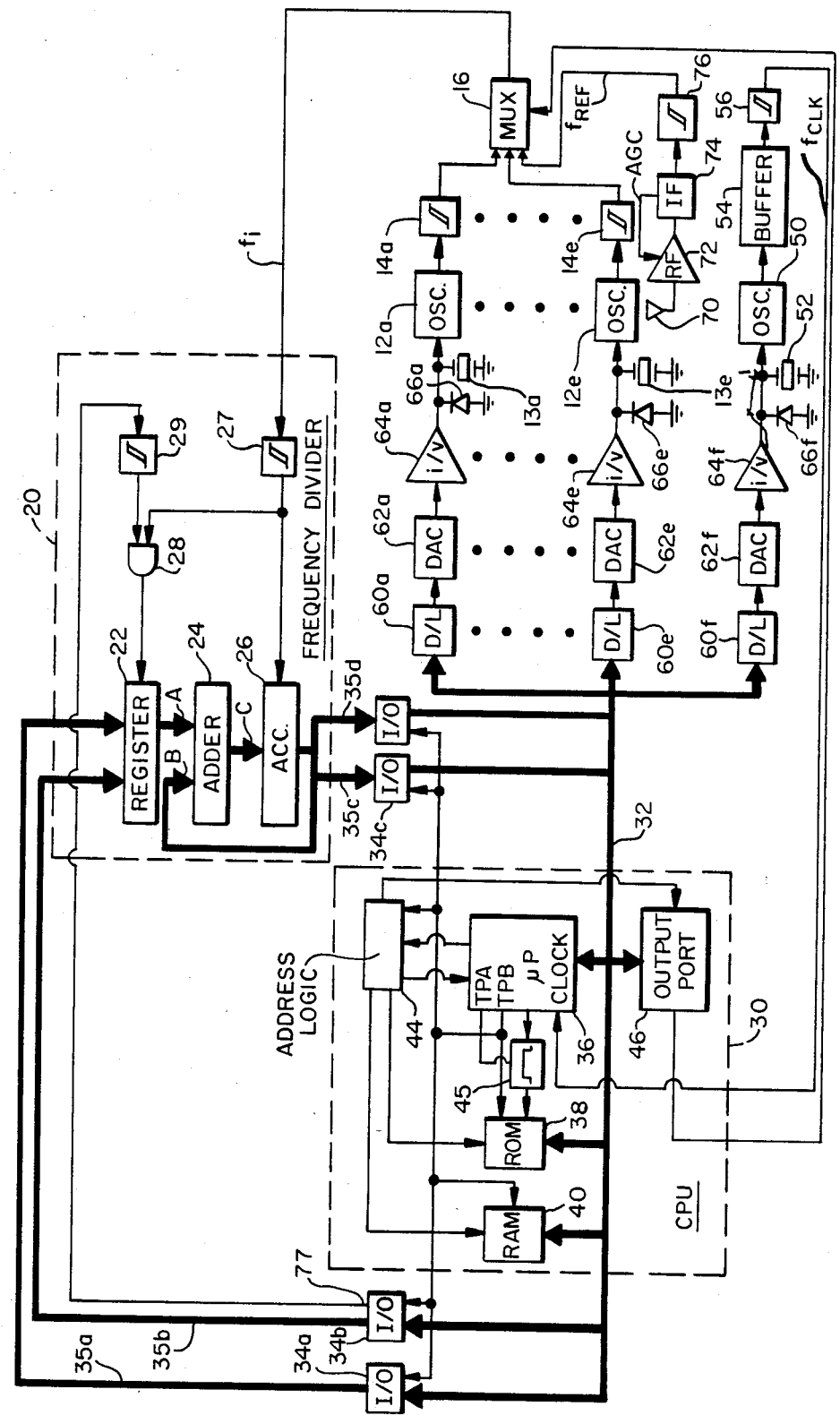
FIG. 1 is a block diagram of an embodiment of the invention.

Refer now to the drawings and, in particular, to FIG. 1 which illustrates the interconnections between the several stages of a system for automatically controlling the frequencies of a plurality of voltage controlled local oscillator circuits $12a \ldots 12e$. Typically, these circuits are Colpitts or Pierce type oscillators used for such purposes as providing carrier frequencies for transmission of digital data over narrowband channels. Each of these circuits provides a sinusoidal output signal having a characteristic frequency determined principally by individual corresponding crystals $13a \ldots 13e$. The signal provided by each oscillator circuit is shaped by pulse shapers such as Schmitt triggers $14a \ldots 14e$ to provide a cyclical square wave output signal having the characteristic frequency of the associated oscillator circuit. The cyclical signals are selectively fed into a multiple channel multiplexer 16 which, when enabled, passes one of the cyclical signals, $f_i$, to a modulo-$2^n$ sum frequency divider 20.

The principal components of frequency divider 20 are a multi-bit input register 22, a full adder circuit 24 and an n-bit accumulator register (ACC) 26 interconnected by multi-bit, parallel data buses A, B and C. The selected cyclical signal passed by multiplexer 16 is again squared by a pulse shaper such as a Schmitt trigger 27 which also introduces a phase inversion in $f_i$ and thereby delays propagation of each pulse by one-half of a clock cycle and is applied simultaneously to one input of an AND gate 28 and a latch control port of accumulator 26. The output from another Schmitt trigger 29 is applied to a second input port of AND gate 28. Concurrence of output signals from both Schmitt triggers 27, 29 causes AND gate 28 to trigger register 22, thereby causing the contents of register 22 (a binary number called the "frequency index") to continuously appear via data bus A at one set of inputs of adder 24. The interposition of Schmitt triggers 27, 29 and AND gate 28 between register 22, accumulator 26 and the applied signals removes any possibility of a glitch causing a spurious output from accumulator 26. Simultaneously, the same output of Schmitt trigger 27 clocks accumulator 26, which latches on the trailing edge of the control pulse, thereby causing its contents to be transferred via data bus B into one set of inputs of adder 24 and subsequently transferred via data bus C to the input port of accumulator 26. Schmitt trigger 27 continues to apply a trigger pulse to accumulator 26 during each cycle of signal $f_i$. Consequently, whenever multiplexer 16 clocks accumulator 26 with a pulse of cyclical signal $f_i$, the contents of accumulator 26 are incremented by the frequency index and transferred back to the accumulator 26. This occurs at a rate of one addition per cycle of signal $f_i$. In effect, frequency divider 20 takes a count of the number of cycles of signal $f_i$ clocking the accumulator while multiplexer 16 is enabled (i.e., the accumulator is clocked by signal $f_i$ during a finite time "sampling interval"). The sampling interval is preset to assure that a large number of cycles (e.g., $10^7$) of signal $f_i$ clock accumulator 26. Accordingly, the product of the duration of the interval and the characteristic frequency of signal $f_i$ exceeds the capacity of accumulator 26. In effect, during a sampling interval frequency divider 20 divides the product of the duration of the sampling interval, the characteristic frequency and the frequency index of its $2^n$ binary capacity.

Frequency division is carried out by divider 20 by taking signal $f_i$ from MUX 16 and using the $f_i$ signal to initiate the successive additions to the binary numbers present on data buses $35a$ and $35b$ as they appear at the adder 24 and accumulator 26. The division factor for divider 20, is, in effect, the ratio of $f_i$ to the output frequency on lines $35c$ and $35d$, which are the time rate of overflow of the accumulator 26, i.e., the ratio of the value of the number at $35a$, $35b$ divided by $2^n$ power, when n is the number of binary bits. As a consequence of the divider 20 design, each time the count exceeds the capacity of accumulator 26 during the sampling interval, the content of the accumulator is returned to all zeros and the carry bit is lost. At the conclusion of the sampling interval, therefore, the contents of accumulator 26 will equal the modulo-$2^n$ sum of the product of the duration of the sampling interval, the characteristic frequency, the frequency index, and the reciprocal, $2^{-n}$, of the accumulator's capacity. This modulo $2^n$ sum is referred to as a "frequency number."

The frequency index is applied to register 22 prior to each sampling interval by a central processing unit 30 via a multi-bit, parallel data bus 32 through two small parallel input-output (I/O) ports $34a$, $34b$ via bidirectional parallel multi-bit data buses 35, $35b^2$. Each of the input-output ports has the same capacity as bus 32; together they inexpensively double the data capacity of the bus. Accumulator 26 is connected to processing unit 30 via data buses B, 32, $35c$ and $35d$, through two parallel input-output ports $34c$, $34d$. CDP1852 chips may serve as the input-output ports for data bus, 32. The principal components of the central processing unit are a microprocessor (P) 36, such as a commercially available CDP1802 manufactured by RCA, a read only memory (ROM) 38, and a random access memory (RAM) 40. The main memory storage for the processing unit is provided by ROM 38 which may be formed by commercially available units, such as a a pair of IM6654 EPROM's providing a $512 \times 8$ bit block of permanent storage for program functions, instructions for controlling the flow of information through the system, and addresses of constants (e.g., frequency indices) stored in memory 40 and used during operation of the system. Memory provided by RAM 40, which may be formed by two commercially available units such as a pair of CDP1822 chips coupled in parallel to provide a $256 \times 8$ bit read/write array, is used for storage of the constants and variables (e.g., the last frequency number) occurring during operation of the system.

Memory locations in ROM 38 and RAM 40 are serially arranged and are addressed by microprocessor 36 through address logic 44 which provides latching and decoding of the microprocessor's memory address lines. Address logic 44 may be formed by a complementary pair of commercially available gate circuits such as a CD4042 quad D-latch and an associated CD4011 quad NAND gate. In such a configuration, enable and chip select signals necessary for microprocessor 36 to address memory locations in ROM 38 and RAM 40 are provided by using a leading timing pulse A (TPA) and a lagging timing pulse B (TPB) sequentially provided by microprocessor 36. Timing pulse A is used to latch the high-order byte of an address in the quad D-latch and timing pulse B is used to latch the low-order byte while a true/complement output from the quad NAND gate furnishes address input bits to ROM 38 and RAM 40. A high speed dual J-K flip-flop 45 (e.g., a 4027-type device manufactured by Fairchild Semiconductor) must be used between ROM 38 and microprocessor 36 to satisfy interface requirements set by the manufacturer of ROM 38 for enabling and disabling ROM 38. Microprocessor 36 applies the TPA signal to the flip-flop J-input port and the main clock signal to multivibrator 45, thereby causing multivibrator 45 to strobe ROM 38 on at appropriate times required for readout of the device data. Timing pulse B is applied to ports 34a, 34b, 34c, and 34d to respectively gate the high- and low-order bytes of the frequency indices and frequency numbers between the input-output ports and the data buses. A control output port 46, formed, for example, by a commercially available unit such as a CDP1852 chip, is used as a latch to receive and hold two or three bit binary selection words (SW) transferred via bus 32 from memory 40. Each selection word specifies one channel of multiplexer 16. When directly addressed by logic 44 as a memory location, a selection word held by output port 46 directly enables multiplexer 16 to apply the cyclical signal on the channel specified to accumulator 26 via Schmitt trigger 27. Address logic 44 continuously addresses output port 46 during the sampling interval.

Although microprocessors such as the CDP1802 are usually able to generate their own clock signals, an external timing source driven by a local oscillator 50 and controlled by a crystal 52, is used as a clock for the microprocessor. As explained more fully hereinafter, the use of oscillator 50 as an external timing source permits the frequency of the timing source to be regulated in the same manner as the frequencies of local oscillators 12a . . . 12e. The output signal of the clock oscillator 50 is passed through a buffer 54 (e.g., a CD4050 non-inverting CMOS buffer), squared by Schmitt trigger 56, and applied as a train of square wave pulses, $f_{CLK}$, directly to the clock port of microprocessor 36, where the clock signal is internally divided (e.g., by eight) down to a frequency which controls the internal operations of the microprocessor and which is used to generate timing pulses A and B during each machine cycle of the central processing unit.

Central processing unit 30 is coupled to a plurality of latches (D/L) 60a . . . 60e, 60f via data bus 32. The latches individually feed multi-bit equivalent digital-to-analog (DAC) converters 62a . . . 62e, 62f. The amplitude of the analog direct-current outputs provided by the digital-to-analog converters are, in turn, applied as constant amplitude control voltages by current-to-voltage converters 64a . . . 64e, 64f to varactor diodes 66a . . . 66e, 66f in the oscillator circuits 12a . . . 12e, 50, respectively. Any shift in the amplitude of a control voltage provided by converters 62a . . . 62f varies the capacitance of the corresponding varactor diode located in the frequency determining network of each oscillator circuit, thereby effecting a small but finite, shift in the output frequency of the oscillator circuit. In effect, the data latches, digital-to-analog converter stages, current-to-voltage converters, and varactor diodes, in conjunction with multiplexer 16, frequency divider 20, and processing unit 30, form a plurality of low-speed, independent, closed automatic frequency-control loops for the local and clock oscillator circuits.

Stability of clock oscillator stage 50 is periodically checked against an external frequency, $f_{REF}$, derived from a reference signal, such as the 10 megahertz WWV carrier frequency. An antenna 70 feeds the WWV carrier to a conventional, high-sensitivity receiver formed, for example, by a front-end radio-frequency amplifier 72 and an intermediate-frequency amplifier 74. Intermediate-frequency amplifier 74, preferably a high-gain amplifier-and-limiter combination having an automatic gain control (AGC) loop to regulate amplifier 72, recovers the carrier signal in squarewave form. A commercially-available CA3089 chip may be used as intermediate frequency amplifier 72. The square wave is applied to a Schmitt trigger 76 (e.g., a 74LS14 hex Schmitt trigger chip), squared, and applied to multiplexer 16. Together, clock oscillator 50, its crystal 52, buffer 54, Schmitt trigger 56, antenna 70, and amplifiers 72, 74 provide a precise, correctable source of timing to the frequency control system.

Before the frequency control system can be used to check and correct the frequency of clock oscillator 50, a selection word must be stored in memory 40 to specify and enable selection of the channel of multiplexer 16 which receives the reference signal ($f_{REF}$) derived from the WWV carrier frequency. Also, a corresponding frequency index, zero error constant, and look-up table of normalizing constants must be stored in memory 40. Moreover, when one or more local oscillators are coupled between the other channels of multiplexer 16 and the corresponding current-to-voltage converters 64a . . . 64e, selection words specifying those channels, together with frequency indices, zero-error constants, and look-up tables of normalizing constants must be stored in memory 40 for each of the local oscillators.

A frequency index is a predetermined multi-bit (typically less than sixteen bits) digital word selected for a particular oscillator to assure that, if the frequency generated by that oscillator is accurate, the frequency number appearing as the contents of register 26 upon termination of a sampling interval will fall within a desired range (e.g., plus or minus one cycle) of a predetermined value (i.e., the zero-error constant). Although the frequency index may have any value within the capacity of adder 24, it is preferable to set the value of a frequency index so that the frequency number obtained after accumulator 26 has been clocked with a particular characteristic frequency will approximately equal the binary equivalent of one-half ($2^{n-1}$) of the capacity ($2^{n-1}$) of the accumulator. For example, the frequency index selected for an oscillator frequency of 401.5451200 megahertz is the binary equivalent of 25,407. This assures that the frequency divider allocates approximately equal ranges of its capacity to detection of both high and low variations in the frequency of the oscillator. The zero-error constant is selected to equal the value of the frequency number obtained by clocking accumulator 26 with an accurate oscillator. Normally, a zero-error constant will have a value nearly equal to the binary equivalent of one-half of the capacity of accumulator 26.

In the frequency-correction scheme previously explained, each of the varactor diodes exhibits a non-linear change in capacitance as a function of the voltage applied by the corresponding current-to-voltage converters. The characteristic frequency generated by a varactor-controlled oscillator accordingly varies non-linearly as a function of the applied varactor voltage. This non-linear function is empirically described for each set of digital-to-analog converters, varactor diodes and oscillators in a table of binary values (normalizing constants) stored in sequentially addressable (look-up) locations in RAM 40. Application of a particular normalizing constant stored in RAM 40 to a corresponding digital-to-analog converter will, therefore, cause a predictable shift in the characteristic frequency of the associated oscillator.

Figure 2:
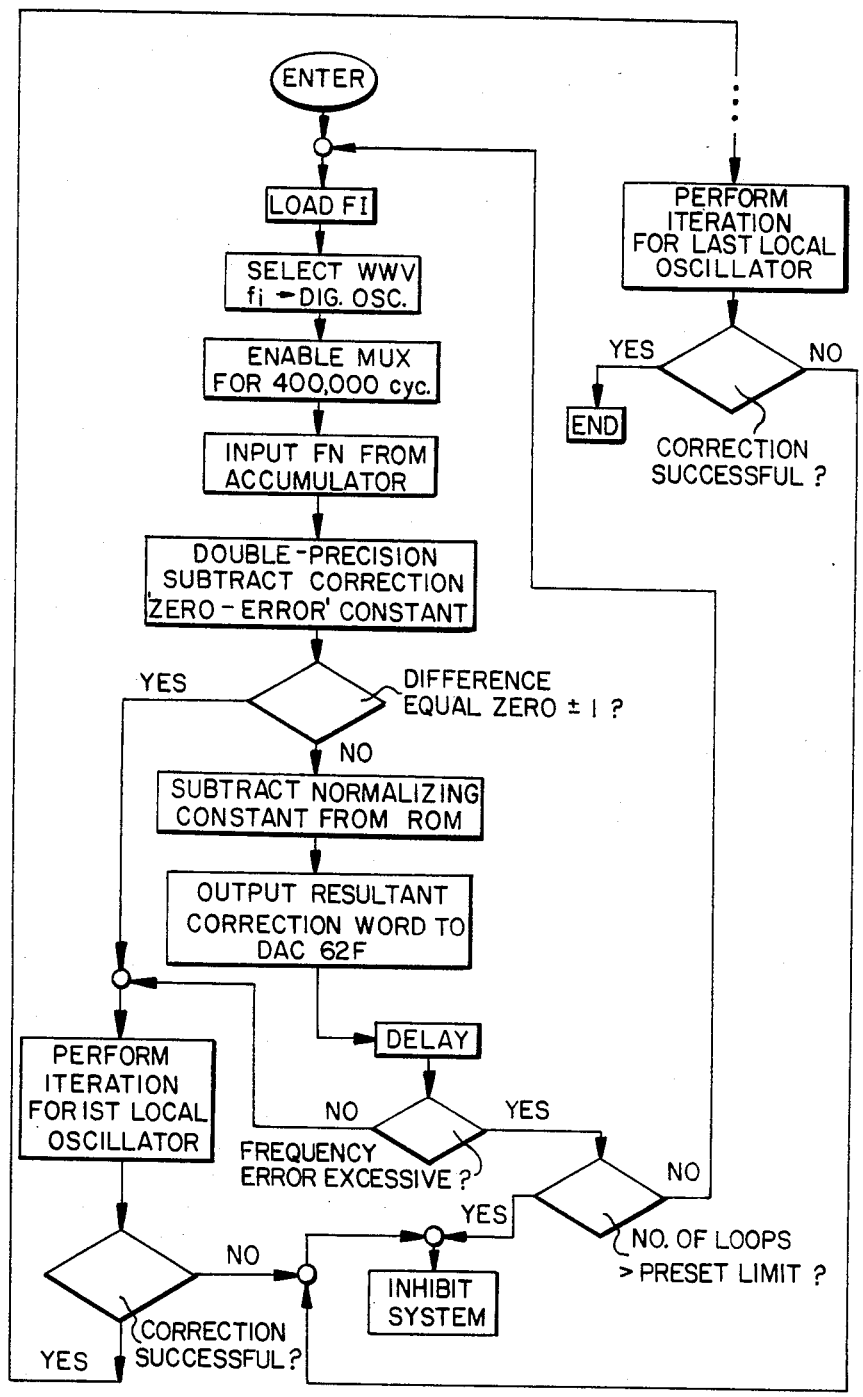
FIG. 2 is a flow chart illustrating one mode of operation for the embodiment of FIG. 1.
Figure 3:
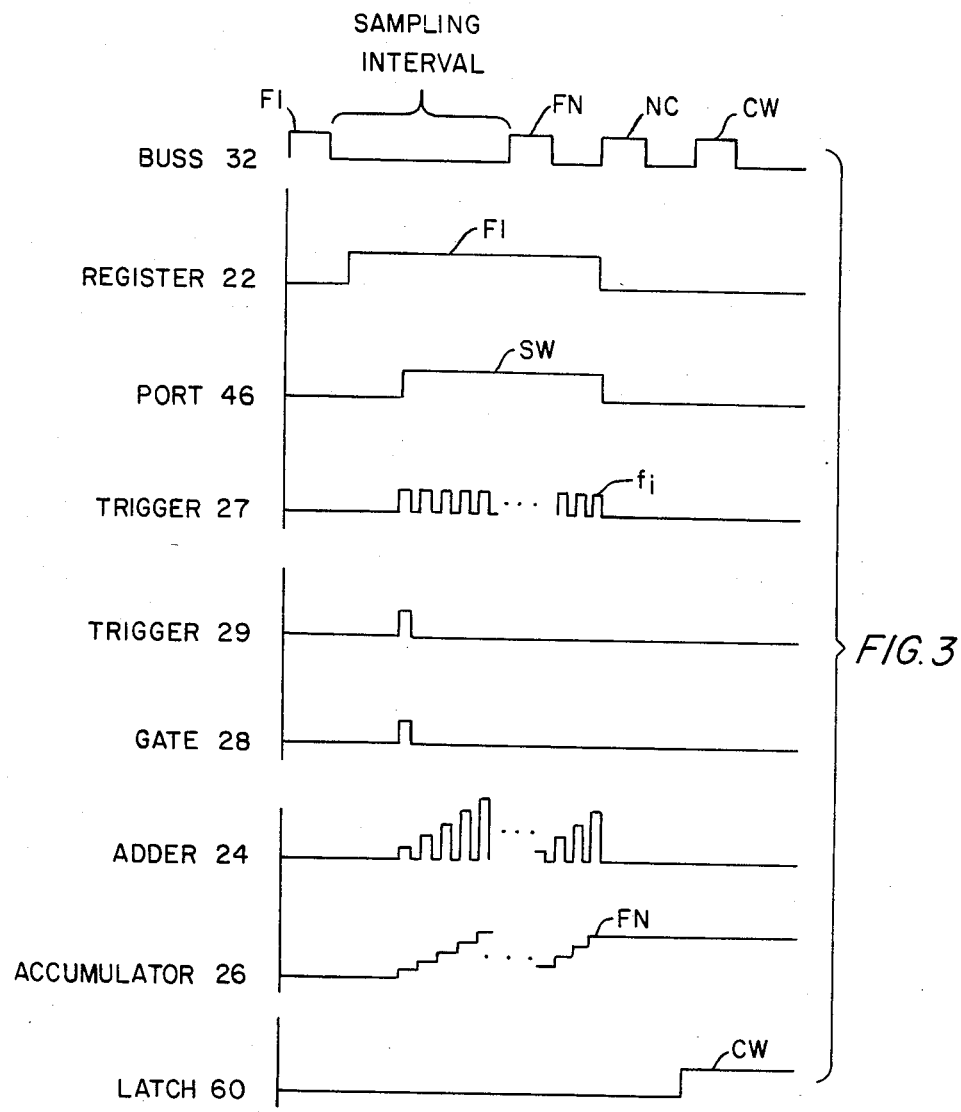
FIG. 3 is a diagrammatical representation of a number of signal pulses occurring in the embodiment of FIG. 1 during a frequency correction routine.

A frequency correction process, the principal steps of which are shown in the flow chart of FIG. 2, begins when a correction routine in the central processing unit causes a frequency index to be transferred from memory 40 to frequency divider input register 22. Transfer is accomplished by sequentially loading successive eight-bit bytes of the frequency index into parallel input-output ports 34a, 34b, both of which typically have an eight bit capacity. The two bytes are then sequentially transferred from ports 34a, 34b into input register 22, a sixteen-bit unit. FIG. 3 shows the sequence of various signals occurring at several points in the system during one iteration of a typical frequency-correction routine.

A subsequent step in the routine activates output port 46 to enable multiplexer 16 with the selection word (SW) corresponding to the frequency index to select one input channel from the several channels of the multiplexer receiving cyclical signals from the WWV stage and the several local oscillators. Preferably, the first selection word specifies the WWV channel, thereby enabling the first iteration of the correction routine to compare the duration of a sampling interval set by the central processor unit against the frequency of a reference signal such as the carrier of WWV. Then, if an error is detected in the duration of the sampling-interval, the frequency of the clock signal provided by oscillator 50 to regulate the timing of microprocessor 36 may be corrected, as explained more fully hereinafter, before the frequencies of the other local oscillators are checked and corrected. While enabled with a selection word specifying the input channel receiving the cyclical WWV carrier signal, multiplexer 16 passes the 10 MHz carrier to Schmitt trigger 27 of frequency divider 20 and the output of trigger 27 is applied to clock the operation of accumulator 26 and to toggle one input port of AND gate 28.

When the lower byte of the frequency index has been loaded into input-output port 34b, a strobe signal is provided by a strobe output terminal 77 of port 34b to the input of Schmitt trigger 29. Propagation delays cause the higher and lower bytes held by ports 34a, 34b to arrive at register 22 at different times during a machine cycle following the strobe signal. The one-half cycle delay, however, caused by Schmitt triggers 27, 29 in application of the strobe signal and the cyclical signal to AND gate 28 provides adequate time for both bytes to be transferred from ports 34a, 34b before AND gate 28 triggers register 22 to transfer the frequency index into adder 24 via data bus A. Moreover, the fact that accumulator register 26 inherently latches on the trailing edge of the signal provided by Schmitt trigger 27 provides a margin of time after the frequency index is transferred from register 22 to adder 24 between transfer of the frequency index from register 22 to adder 24 before the contents of accumulator 26 are transferred via data bus B to adder 24. The multiplexer is held enabled by output port 46 for a precise number of machine cycles. In a CDP1802 microprocessor, for example, 400,000 machine cycles will provide a sampling interval of very nearly one second for a clock frequency of 3.2 MHz. During this interval, $10^7$ cycles of the WWV 10 MHz carrier will cause accumulator register 26 to be clocked $10^7$ times. By way of example, with an initial accumulator count of zero and a frequency index having a value of one, during the first cycle of the WWV carrier adder 24 generates the sum 000 . . . 001; this digital count is immediately transferred to accumulator 26. During the next cycle the adder increments the digital count by one, the value of the frequency index, and again transfers the count to the accumulator. The adder continues to increment the count by the value of the frequency index during each cycle until the register output word equals 111 . . . 111. The next clock pulse causes the count to exceed the capacity ($2^n$) of the accumulator, thereby returning the count to 000 . . . 000, its initial value. The count progresses linearly with clock pulses from all zeros to all ones. As indicated by FIG. 3, the contents of accumulator 26 represent a ramp function with periodic resets to zero each time the count exceeds the capacity of the accumulator. In this routine the highest carry (i.e., the overflow) bits are ignored and only a sufficient number of the least significant accumulator bits necessary to provide the desired degree of accuracy are transferred from accumulator 26 at the end of the sampling interval. Transfer of the sixteen least significant bits from the accumulator register provides a frequency number with a range of 0 to 65,535 (i.e., 0 to $2^{16}-1$) pulse counts. With the 10 MHz WWV signal clocking the accumulator, for example, the accumulator will be incremented $10^7$ times over a one second sampling interval. By virtue of being clocked $10^7$ times over a one second sampling interval, the frequency divider is able to detect a frequency drift in the clock oscillator with an accuracy of at least one in $10^7$ pulses of the cyclical signal $f_i$. For a 10 MHz cyclical signal and a 3.2 MHz clock oscillator, this is equivalent to a minimum error resolution of ±0.32 Hertz in frequency.

Upon termination of the sampling interval, address logic 44 signals output port 46 to stop application of the selection word to multiplexer 16, thereby disabling the multiplexer and discontinuing clocking of accumulator 26 with the 10 MHz cyclical signal. The contents of the sixteen least significant bits of the accumulator register provide a frequency number, FN, equal to the modulo-($2^n \cdot Q$) sum given by the following expression:

$$FN = [MC \cdot t_{mc} f_{REF} \cdot FI_{CLK}] \oplus [2^n \cdot Q] \tag{1}$$

where
MC is the number of machine cycles occurring during the interval;
$t_{mc}$ is the period of a machine cycle;
$f_{REF}$ is 10 MHz, the carrier frequency of WWV;

$FI_{CLK}$ is the frequency index for the clock oscillator applied via bus A;

$2^n$ is the capacity of the accumulator register, and Q is the number of accumulator overflows All of these parameters except $t_{MC}$ are fixed in value during the first iteration. The frequency number is sequentially loaded as two successive eight-bit bytes into parallel input-output ports 34c, 34d. These two bytes are then sequentially transferred from the input-output ports via data bus 32 into microprocessor 36. The contents of the accumulator immediately prior to a sampling interval, which were stored in memory 40, are now subtracted from the frequency number, unless, the accumulator is reset at the start of the correction cycle. A predetermined "zero error" constant which represents an ideal pulse count is transferred from RAM 40 to the microprocessor and compared, by double precision subtraction, to the difference between the frequency number (FN) generated by the current sampling interval and the contents of the accumulator prior to the current sampling interval. If the difference resulting from the subtraction is either zero or within a preset tolerance range (e.g., plus or minus one pulse) then the sole variable in equation (1), the period of the machine cycles, is accurate to a tolerance within the preset range (i.e., one count in ten million) and the routine automatically proceeds to repeat the iteration for the first of the local oscillators. A difference of ±m, however, means that the period of the machine cycles is incorrect, thereby indicating that the clock oscillator initiating each machine cycle has slipped from its assigned frequency by ±(m+1) parts in ten million. The difference, m, is used to address a normalizing constant (NC) in memory 40. The normalizing constant, which represents the approximate voltage-versus-frequency characteristics of varactor diode 66f upon clock oscillator 50, is transferred from a look-up table in memory 40 to the microprocessor and subtracted from the difference, m, thereby providing a correction word (CW) normalized to the specific characteristics of varactor diode 66f. The correction word is transferred from the microprocessor via data bus 32, to data latch 60f and converter 62f, thereby completing one iteration of the frequency-correction routine. If a higher degree of accuracy is required, if the voltage-versus-frequency control characteristic of the clock oscillator is non-linear (a characteristic common in many inexpensive oscillator circuits), or if a deviation in the frequency of the clock oscillator is too excessive to correct in a single iteration, the iteration would generally be repeated until the difference between the contents of the accumulator register after each interval and final number is reduced to zero and remains at zero for one or more successive iterations.

Once a correction of the clock oscillator has been successfully completed, a frequency index corresponding to one of the local oscillators is transferred from memory 40 to input register 22 via data buses 32, 34a, 34b and output port 46 is instructed to enable multiplexer 16 to pass the cyclical signal from the corresponding local oscillator 12a . . . 12e and its associated Schmitt trigger 14a . . . 14e. Upon termination of the second sampling interval, the frequency number held in the accumulator register equals the modulo-($2^n$.Q) sum given by the following expression:

$$FN = [MC \cdot t_{MC} \cdot f_i \cdot FI_i] \oplus [2^n \cdot Q] \quad (2)$$

where $f_i$ is the actual frequency of the local oscillator;
$FI_i$ is the corresponding frequency index; and
Q is the number of accumulator overflows during the interval.

All of these parameters except $f_i$ are constants during the second iteration. Consequently, a non-zero difference outside a preset tolerance range (e.g., ±1 pulse) after subtraction of the prior contents of accumulator and the corresponding "zero-error" constant is a gauge of a variation between the actual and assigned frequencies of the local oscillator. As in the iteration for correction of the clock oscillator, a non-zero difference results in generation of a correction word which is then applied to the corresponding data latch and digital-to-analog converter to effect a corrective shift in the frequency provided by the local oscillator.

The routine then continues until the frequencies of all of the local oscillators have been checked and successfully corrected. The routine includes an internal preset limit upon the number of iterations undertaken for correction of the clock oscillator; if this limit is reached without its successful correction, operation of the system is inhibited to prevent a possible off-frequency use of the local oscillators. After the routine has successfully checked and corrected the frequencies of all of the local oscillators, their cyclical signals may be applied to other networks for operational use.

It may also be noted that by comparing a frequency number against a judiciously selected number other then the ideal count corresponding to the zero error frequency variation, the frequency of the local oscillator being checked can be shifted, over a limited range, checked for accuracy, and then used for such purposes as providing a carrier signal for transmission of data over a neighboring channel.

Figure 4:
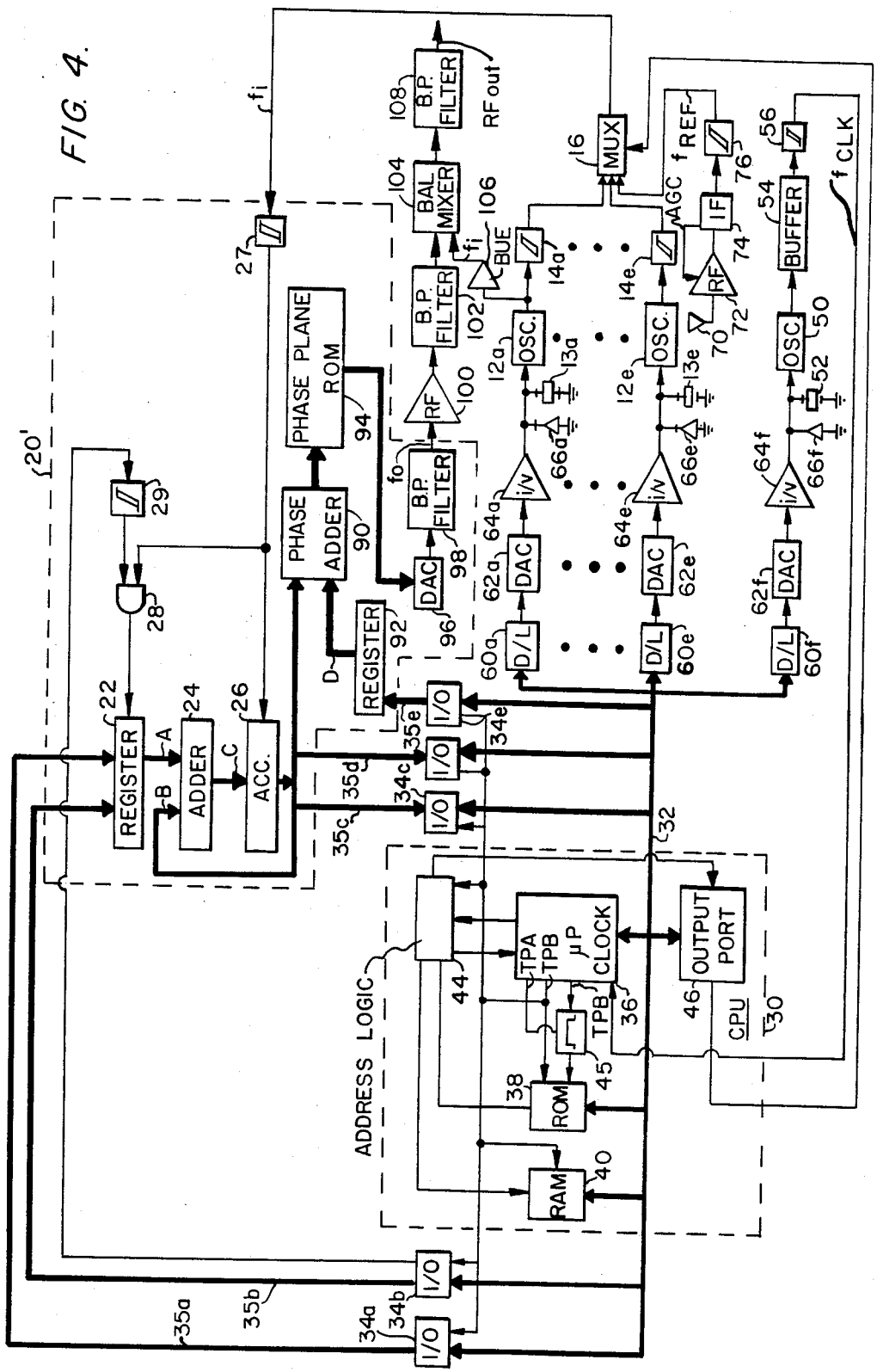
FIG. 4 is a block diagram of the embodiment of FIG. 1 modified to provide angle modulation.

The frequency control system of this invention provides a reliable correction network assuring a high degree of frequency stability, especially over a long term, for numerous local oscillator stages and thereby eliminates any need for energy consuming crystal ovens to provide frequency stability. With minor additions to the frequency divider 20, the system may also be used to provide a digitally-controlled form of angle modulation (frequency-shift or phase-shift keying) for narrow-bandwidth signals driven by one or more of the local oscillator signals. FIG. 4 illustrates an alternative version of a frequency correction system in which a frequency divider 20' is enhanced by the addition of a full adder to serve as a phase adder 90, thereby permitting direct synthesis of phase-shift-keyed (PSK) radio-frequency signals. When the system is used in a frequency-synthesis mode (as opposed to in an oscillator frequency-correction mode), accumulator 26 is continuously clocked by a radio-frequency signal, $f_i$, from one of the local oscillator circuits 12a while central processing unit 30 applies a constant frequency index, FI, to input register 22. The most significant eight bits of the accumulator output are applied via data bus B directly to one input port of phase adder 90. Simultaneously, central processing unit 30 applies a predetermined multi-bit binary number stored in memory, as a phase index, PI, to the second input of phase adder 90 via an input-output port 34e, data bus 35e, an input register 92, and data bus D.

Typically, a phase index is an eight bit binary number which, when added to the eight most significant bits of the accumulator output, causes the output from the phase adder to be incremented by the value of the phase index. The sum provided by adder 90 immediately appears at the input of a phase-plane read-only memory (ROM) 94. The actual value of the phase index depends upon the phase shift desired from the system.

ROM 94 is a memory with a capacity of 256 eight bit words. A commercially available unit such as an 74S473 PROM is suitable for use as ROM 94. The data stored in ROM 94 represents one complete cycle of a time-varying waveform such as a sine wave, with an added direct current offset incorporated into the data to allow a continuous, unipolar analog signal (such as a sine wave) to be produced by a digital-to-analog converter 97 fed by the ROM. This data is stored as sequential segments of the waveform in memory locations which are serially addressable by the contents of accumulator register 26. The minimum phase shift obtainable from each phase step for an eight-bit ROM address is:

$$\frac{\text{One cycle} = 360°}{256 \text{ increments}} = 1.40625°/\text{step} \quad (3)$$

Thus, if a ±1 radian phase shift is desired, the value of the phase index supplied to register 92 must be changed by:

$$\frac{\pm \text{ one radian} = \pm 56.2500°}{1.40625°} = \pm 40.$$

Phase shift occurs when the central processing unit, as part of a phase modulation routine, changes the value of the phase index applied to register 92, thereby causing an equal, non-sequential shift in the phase plane address provided by phase plane adder 90. Consequently, phase plane ROM 94 provides as its output a digital segment of the time-varying waveform which is separated, by one or more segments, from the segment provided immediately prior to the change of the phase index.

For a phase plane memory with 256 addresses, the phase shift obtainable in a single change in the phase index is defined as any integral multiple of ±1.40625° up to ±180° and is readily obtained by applying the appropriate positive or negative (in two's complement form) values of the phase index to phase adder 90 via data bus D. A positive phase index causes the output wave from converter 96 to advance while a negative phase index causes a phase retardation. A bandpass filter 98 may be included to remove undesired spectral energy centered around the input frequency, $f_i$, and its harmonics from the analog signal provided by converter 96.

Frequency shift keying (FSK) modulation is obtained by changing the frequency index applied to input register 22. If the frequency index is increased from one (000 ... 001) to two (000 ... 010), for example, the output from accumulator 26 will be incremented in value twice as fast because, on each pulse of $f_i$, the contents of the accumulator will now be incremented by two. The frequency of the output signal, $f_o$, passing through filter 98 is related to the input frequency, $f_i$, clocking the accumulator, the frequency index, and the capacity of the accumulator register by the equation:

$$f_o = \frac{f_i \cdot FI}{2^n}. \quad (5)$$

The minimum increment of frequency shift, $f_{min}$, obtainable for any particular system with a single local oscillator clocking the accumulator is given by:

$$\Delta f_{min} = \frac{f_i}{2^n}. \quad (6)$$

This feature is particularly advantageous in multi-channel communications because $f_{min}$ may be set equal to either the desired unipolar FSK frequency deviation (or to a submultiple thereof) or the desired interchannel spacing (or a submultiple), or both. Then, either the FSK deviation or the center channel frequency, or both, may be digitally selected merely by an appropriate change of the frequency index. It should be noted that the input frequency, $f_i$, must be an integral multiple of the "bit rate" of the digital data to be transmitted to provide (for CPFSK/MSK modulation) continuous-phase zero crossings in the output waveform and thereby avoid occurrence of glitches or jitter due to non-synchronous data changes. This constraint does not apply for standard FSK, however.

The modulated output frequency, $f_o$, is approximately an order of magnitude lower than the frequency, $f_i$, of the signal clocking accumulator 26, and is first amplified by a radio-frequency amplifier 100, filtered by a bandpass filter 102, and applied to one port of a balanced mixer 104. The cyclical signal from local oscillator 12a is applied, via a buffer amplifier 106, to a second port of mixer 104 where it is mixed with the modulated output frequency. The output from mixer 104, $RF_{out}$, is filtered at the sum frequency, $f_o + f_i$, and passed to subsequent transmitter stages (not shown) where it may be multiplied to provide a desired carrier frequency.

Figure 5:
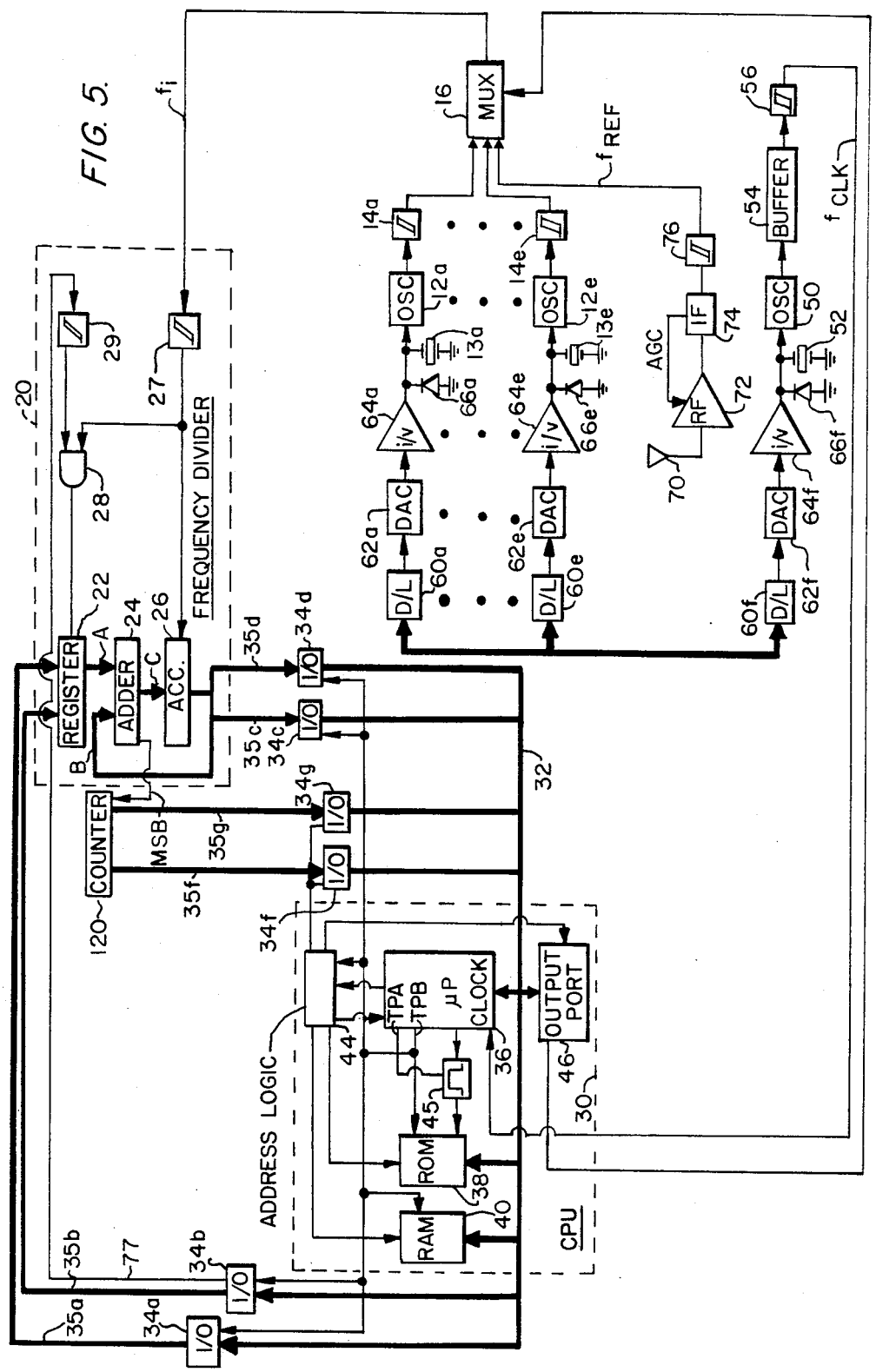
FIG. 5 is a block diagram of the embodiment of FIG. 1 modified to provide a wide range of frequency control.

As shown by FIG. 5, the system may be modified to provide control of oscillators over a wide range of frequencies. A medium speed counter 120 formed by such components as an LSI device of a pair of CD4040's is coupled to receive the most significant bit, MSB, of adder 24. This enables counter 120 to provide a numerical representation of the number of times adder 24 overflows its capacity during each sampling interval. Counter 120 is connected to processing unit 30 via data buses 35f, 35g, through two parallel input-output ports 34f, 34g. After each sampling interval the contents of accumulator 26, FN, and the contents of counter 120, Q, will provide an aggregate value:

$$Q + \frac{FN}{2^n} = \frac{MC \cdot t_{mc} \cdot f_{REF} \cdot FI_{CLK}}{2^n} \quad (7)$$

In effect, Q is an integer number quotient and FN is a remainder. Intuitively, the value of Q is analogous to the characteristic of a logarithm and FN represents the mantissa of the same number.

Figure 6:
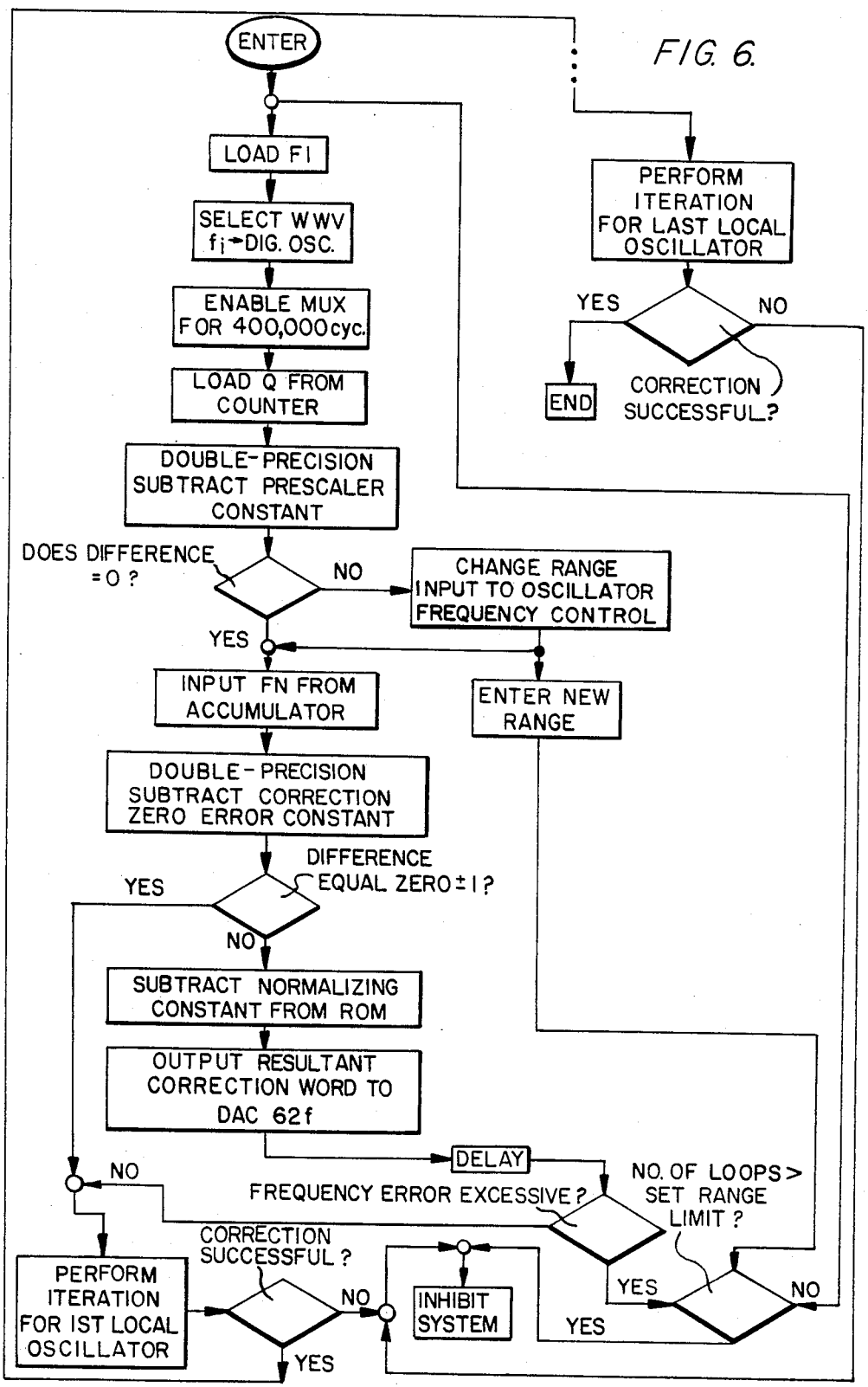
FIG. 6 is a flow chart illustrating the mode of operation of the embodiment of FIG. 5.

As shown in FIG. 6, it is possible to use counter 120 in a prescaling iteration to extend the range of frequencies over which a system may regulate a voltage controlled oscillator. In such an application, the value of Q obtained from counter 120 after multiplexer 16 had been held enabled during a sampling interval will be loaded into microprocessor 36 via input-output ports 34f, 34g and compared with a prescaler constant stored in memory 40 as a program parameter for regulation of a particular voltage controlled oscillator. The value of Q is compared with the prescaler constant in a double precision subtraction routine. If the difference between Q and the prescaler constant is zero, the correction scenario will continue as shown in FIG. 2 by next loading the value of FN into microprocessor 36 from accumulator 26. If the difference is not zero, however, the difference is used to address a look-up table stored in memory 40 and obtain a new value for the range of the system. The new value for the range obtained from the loop-up table is entered and the interation continues by loading the frequency number, FN, from accumulator 26 into microprocessor. By changing the prescaling constant, the system is enabled to proceed through a greater frequency correction range without causing an inhibit condition. By appropriate pre-selection of the prescaler values stored in a control program, the system can use the value of Q as a coarse frequency adjustment gauge and thereby cause changes in the varactor voltages in larger steps with each iteration than before. In this control scheme, the measured values of FN provide fine frequency control for the oscillators.

The system disclosed provides enhanced long-term frequency stability without a continuous excessive consumption of power, to a plurality of local oscillator circuits by the expedient of using a central processing unit to compare pulse counts obtained from an accumulator-type frequency divider stage clocked by the oscillator circuit being checked. By making an initial comparison of its own timing circuit against a frequency of known accuracy and then sequentially checking, and correcting, the frequencies of the local oscillators, the system is able to assure that its timing circuit is accurate to one part in ten million and then, in subsequent iterations, to use the accuracy of its timing circuit to gauge and, if necessary, correct any deviation in the frequencies of the local oscillators to the same degree of precision. The usefulness of the system in one of its most likely applications—providing frequency stability in a multi-channel digital data transmitter—is enhanced by inclusion of a second adder and a phase plane ROM in its frequency-divider stage to enable the system to directly provide MSK, FSK, and PSK modulation of radio frequency signals generated by the local oscillator circuits.

I claim:

1. A frequency control system, comprising:
    divider means (20) including a register (26) having n-bits of binary capacity and means (24) for incrementing the contents of said register with a first number in response to reception of each pulse of a cyclical signal;
    programmable processing means (30) interconnected with said divider means and operable in sequential machine cycles for generating said first number and second number during an interval set by a fixed number of said machine cycles wherein said first number and said second number correspond to an assigned frequency and are employed for comparing the contents of said register (26) with a predetermined number upon termination of said interval, and further, are employed for propagating a correction signal determined by any difference between said contents and said predetermined number;
    a source (12a/12e, 14a/14e, 66a/66e) providing a cyclical signal with a characteristic frequency that is correctable by reception of a shifting signal;
    switching means (16) connectable to said source, operatively enabled during reception of said second number to apply said cyclical signal to said divider means;
    converting means (60a/60e, 62a/62e, 64a/64e) operatively responsive to said processing means for applying said shifting signal to said source upon reception of said correction signal; and
    timing means (50, 52, 54, 56, 66f) coupled to said processing means for initiating each of said machine cycles, whereby after said termination of said interval, said contents of said register (26) contain a modulo-$(2^n \cdot Q)$ sum representing the product of said first number, said characteristic frequency, the duration of said interval, and $2^{-n}$, thereby enabling said programmable processing means to gauge any variation in the product of the period of said machine cycles and said characteristic frequency by comparing said sum to said predetermined number, to use said variation to determine the value of said correction signal, and to apply said correction signal to said converting means.

2. The frequency control system of claim 1 wherein the product of said duration of said interval and said characteristic frequency exceeds said capacity of said register (26).

3. The frequency control system of claim 2 wherein the value of said first number is predetermined to permit said modulo-$(2^n \cdot Q)$ sum to approximately equal $2^{n-1}$ upon termination of said interval when said variation is substantially zero.

4. The frequency control system of claim 3 wherein said timing means (50, 52, 54, 56, 66f) includes other converting means (60f, 62f, 64f) operatively responsive to said processing means for providing said shifting signal, an input coupled to said other converting means and a stage exhibiting a shift in resonant frequency in response to application of said shifting signal whereby said timing means generates a timing signal initiating each of said machine cycles and the characteristic frequency of said timing signal is determined by said resonant frequency.

5. The frequency control system of claim 4 wherein said divider means includes means (94, 96) coupled to receive said contents of said register for converting said contents into sequential components of a time-varying signal, whereby a change in the value of said first number causes a shift in the frequency of said time-varying signal.

6. The frequency control system of claim 5 wherein said divider means further comprises adder means (90) interposed between said register and said converting means for providing digital numbers varying in value from said contents by a third number, whereby a change in value of said third number causes a shift in the phase of said time-varying signal.

7. A frequency control system, comprising:
    programmable processing means (30) including a memory (38, 40) and a routine stored in said memory for controlling the operation of said frequency control system;
    said memory containing, for a source providing a cyclical signal having a characteristic frequency connectable to said system, a selection word, index number, and ideal count corresponding to the assigned frequency of said source;
    said processing means providing to said system during a sampling interval, a selection word and index number corresponding to said source, and after said sampling interval for comparing the corresponding ideal count stored in memory with n least-significant bits of a digital count made during said interval and propagating a correction number determined by any difference between said ideal count and said n least-significant bits of said digital count;

means (20) interconnected with said programmable processing means for incrementing said index number once per cycle of said characteristic frequency to make said digital count while being clocked by said cyclical signal, said incrementing means having a register (26) with n bits of binary capacity, for retaining said n least-significant bits of said digital count;

means (16) connectable to said source providing a cyclical signal having said characteristic frequency and enabled by said selection word for clocking said incrementing means with said cyclical signal;

means (60a . . . 60f, 62a . . . 62f, 64a . . . 64f, 66a . . . 64f) connectable to said source and operatively responsive to said processing means for shifting said characteristic frequency upon reception of said correction number; and timing means connectable to said processing means and shifting means for regulating the duration of said interval.

8. The frequency control system of claim 7 wherein said duration of said sampling interval is set equal to a fixed number of machine cycles of said processing means (30) and said timing means comprises a clock providing a timing signal initiating each of said machine cycle.

9. The frequency control system of claim 8 wherein:

said timing means further comprises a reference source (70, 72, 74, 76) providing a cyclical signal having a fixed reference frequency to said cyclical signal providing means; and said clock includes an input terminal coupled to said shifting means and means connected to said input for providing a shift in impedance in response to the application of said shifting signal to said input terminal.

10. The frequency control system of claim 9 wherein said memory includes look-up tables of constants related to said source for generating said correction number in response to any difference between said ideal count and said least-significant bits of said digital count.

11. The frequency control system of claim 10 wherein said binary capacity of said register is less than the product of said index number, the corresponding assigned frequency of said source, and the duration of said sampling interval.

12. The frequency control system of claim 11 wherein said incrementing means includes:

memory means (94) operatively connected to said register, for storing a plurality of sequential components of a time-varying signal, said sequential components being serially addressable by said n least-significant bits of said digital count; and means (96) receptively coupled to said memory means for receiving and converting said sequential components into a time-varying waveform.

13. The frequency control system of claim 12 wherein said incrementing means further comprises adder means (90) interposed between said register and said memory means and coupled to receive a phase index for varying the values of said n least-significant bits addressing said sequential components by the value of said phase index.

14. The frequency control system of claim 11 wherein said incrementing means includes an adder (24) providing data input to said register (26), further comprising counting means (120) operatively interconnected between said adder and said processing means for maintaining a running count of the number of occurrences of overflow in the most significant bit of said n-bit register during each sampling interval, thereby enabling said processing means to provide control over a wide range of frequencies.

15. A frequency control system, comprising:

a programmable central processing unit (30) containing a memory (38, 40) and a routine stored in said memory for controlling operation of said frequency control system in sequential machine cycles, said memory including a selection word, a plurality of frequency index numbers, a plurality of phase index numbers, and an ideal count;

said processing means providing to said system said selection word and selected ones of said frequency and said phase index numbers and propagating a correction word determined by comparison of said ideal count and with the contents of an n-bit register upon expiration of a sampling interval set by a fixed number of said machine cycles;

a frequency divider (22, 24, 26), including said n-bit register, interconnected with said processing unit and cyclically incrementing the contents of said n-bit register when clocked by a cyclical signal;

switching means (16) connectable to a source providing a cyclical signal, said source having an electrically variable characteristic frequencies, said clocking means being operatively enabled during reception of said second number to apply said cyclical signal to said divider means;

a timing circuit (50, 52, 54, 56) including a voltage controllable oscillator exhibiting a characteristic frequency, providing a timing signal initiating each of said machine cycles;

means (60a . . . 60f, 62a . . . 62f, 64a . . . 64f, 66a . . . 66f) connectable to said processing means for shifting a selected one of said source generated characteristic frequencies upon reception of said correction signal;

a first adder (90) interconnected to said n-bit register and said processing unit to continuously generate the sum of the contents of said register and said one of said phase index numbers;

a memory (94) containing sequential components of a time varying waveform addressable by said sum; and means (96) for converting said sequential components into a time varying analog signal.

16. The frequency control system of claim 15 wherein said frequency divider includes a second adder (24) providing data input to said n-bit register, further comprising counting means (120) operatively interconnected between said second adder and said processing unit for maintaining a running count of the number of occurrences of overflow in the most significant bit of said n-bit register during each sampling interval, thereby enabling said processing means to provide control over a wide range of frequencies.

* * * * *